(12) United States Patent
Kim et al.

(10) Patent No.: US 10,091,884 B2
(45) Date of Patent: Oct. 2, 2018

(54) DISPLAY DEVICE WITH A REINFORCING MEMBER FOR IMPROVED DURABILITY

(71) Applicant: SAMSUNG DISPLAY CO., LTD., Yongin-si, Gyeonggi-do (KR)

(72) Inventors: Jihoon Kim, Incheon (KR); Yongmin Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/230,374

(22) Filed: Aug. 6, 2016

(65) Prior Publication Data

US 2017/0142837 A1     May 18, 2017

(30) Foreign Application Priority Data

Nov. 18, 2015 (KR) .................. 10-2015-0162073

(51) Int. Cl.
| | | |
|---|---|---|
| *H05K 1/18* | (2006.01) | |
| *H05K 7/20* | (2006.01) | |
| *H05K 1/14* | (2006.01) | |
| *H01L 51/52* | (2006.01) | |
| *H05K 1/02* | (2006.01) | |

(52) U.S. Cl.
CPC ......... *H05K 1/181* (2013.01); *H01L 51/5237* (2013.01); *H05K 1/0271* (2013.01); *H05K 1/147* (2013.01); *H05K 1/189* (2013.01); *H05K 7/20963* (2013.01); *H05K 2201/0323* (2013.01); *H05K 2201/10128* (2013.01); *H05K 2201/2009* (2013.01)

(58) Field of Classification Search
CPC ... H01L 51/529; H01L 51/5237; H01L 27/32; H05K 1/0204; H05K 1/0271; H05K 1/0274; H05K 1/147; H05K 1/181; H05K 1/189; H05K 7/20963; H05K 2201/0323; H05K 2201/10128; H05K 2201/2009

See application file for complete search history.

(56) References Cited

U.S. PATENT DOCUMENTS

| | | | | |
|---|---|---|---|---|
| 6,411,353 B1 * | 6/2002 | Yarita | ............ | G02F 1/133308 349/150 |
| 7,436,668 B2 * | 10/2008 | Bae | ............ | G06F 1/1601 349/58 |
| 7,980,717 B2 * | 7/2011 | Kim | ............ | G02F 1/133603 362/97.1 |

(Continued)

FOREIGN PATENT DOCUMENTS

| | | |
|---|---|---|
| KR | 10-2012-0032349 A | 4/2012 |
| KR | 10-2013-0065240 A | 6/2013 |

(Continued)

*Primary Examiner* — Zachary M Pape
(74) *Attorney, Agent, or Firm* — Lewis Roca Rothgerber Christie LLP

(57) ABSTRACT

A display device includes a display panel, a printed circuit board under the display panel and having one surface on which a driving chip is mounted, a first reinforcing member between the display panel and the printed circuit board, and a second reinforcing member under the printed circuit board, configured to face the printed circuit board having the driving chip therebetween, the second reinforcing member having a recessed groove in one surface facing the driving chip and the driving chip being in the recessed groove.

18 Claims, 7 Drawing Sheets

(56) References Cited

U.S. PATENT DOCUMENTS

| | | | | |
|---|---|---|---|---|
| 8,339,030 | B2* | 12/2012 | Nakanishi | G02F 1/1345 313/483 |
| 8,599,329 | B2* | 12/2013 | Kang | G02F 1/133608 349/58 |
| 8,698,131 | B2* | 4/2014 | Gyoda | H01L 51/5237 257/40 |
| 2005/0088092 | A1* | 4/2005 | Kim | H05K 7/20963 313/582 |
| 2008/0068313 | A1* | 3/2008 | Jang | G02F 1/13452 345/87 |
| 2009/0002928 | A1* | 1/2009 | Murakami | G02F 1/133308 |
| 2009/0135096 | A1* | 5/2009 | Jeong | H05K 7/1461 345/60 |
| 2012/0306830 | A1* | 12/2012 | Kimura | B81C 1/00103 345/205 |
| 2013/0021662 | A1* | 1/2013 | Fike, III | G02B 26/02 359/291 |
| 2014/0112019 | A1* | 4/2014 | Baek | G09F 9/30 362/613 |
| 2014/0184938 | A1* | 7/2014 | Chen | G06F 3/0412 349/12 |
| 2016/0014880 | A1* | 1/2016 | Lee | H05K 1/028 361/752 |

FOREIGN PATENT DOCUMENTS

| | | |
|---|---|---|
| KR | 10-1321271 | 10/2013 |
| KR | 10-1366701 | 2/2014 |
| KR | 10-2014-0035620 A | 3/2014 |
| KR | 10-2015-0009368 A | 1/2015 |
| KR | 10-1485781 | 1/2015 |

\* cited by examiner

DISPLAY DEVICE WITH A REINFORCING MEMBER FOR IMPROVED DURABILITY

CROSS-REFERENCE TO RELATED APPLICATIONS

This U.S. non-provisional patent application claims priority under 35 U.S.C. § 119 to and the benefit of Korean Patent Application No. 10-2015-0162073, filed on Nov. 18, 2015, the entire contents of which are hereby incorporated by reference.

BACKGROUND

1. Field

Embodiments of the present invention relate to a display device.

2. Description of the Related Art

Recently, portable terminals are being widely used by users. The portable terminals may include a display panel for displaying an image and a window. Because the display panel is vulnerable to an impact, display defects, such as spots, may occur due to an impact caused when the portable terminal is dropped.

SUMMARY

The present disclosure provides a display device having improved durability.

An embodiment of the inventive concept provides a display device including a display panel configured to display an image; a printed circuit board under the display panel and having one surface on which a driving chip is mounted; a first reinforcing member between the display panel and the printed circuit board; and a second reinforcing member under the printed circuit board, configured to face the printed circuit board having the driving chip therebetween, the second reinforcing member having a recessed groove in one surface facing the driving chip and the driving chip may be in the recessed groove.

In an embodiment, a depth of the recessed groove may be greater than or equal to a thickness of the driving chip.

In an embodiment, the second reinforcing member may have a first region overlapping the driving chip and a second region surrounding the first region on a plane, and the first region may have a first thickness and the second region may have a second thickness that is greater than the first thickness.

In an embodiment, the second reinforcing member may include a light-shielding layer, and a cushion layer between the light-shielding layer and the printed circuit board.

In an embodiment, the cushion layer may have a third thickness in the first region and may have a fourth thickness that is greater than the third thickness in the second region.

In an embodiment, a difference between the third thickness and the fourth thickness may be greater than or equal to the thickness of the driving chip.

In an embodiment, the cushion layer may not overlap the first region when viewed from a thickness direction of the display panel.

In an embodiment, a thickness of the cushion layer may be greater than or equal to the thickness of the driving chip.

In an embodiment, the first reinforcing member may include a light-shielding layer, a heat dissipation layer on the light-shielding layer, and a shielding layer on the heat dissipation layer, and the shielding layer may be attached to a rear surface of the display panel.

In an embodiment, the shielding layer may include a conductive material, and the heat dissipation layer may include graphite molecules.

In an embodiment, the display device may further include a bracket under the second reinforcing member.

In an embodiment, an accommodating groove may be at one surface of the bracket that is in contact with the second reinforcing member, and the second reinforcing member may be in the accommodating groove.

In an embodiment of the inventive concept, a display device includes a display panel; a printed circuit board under the display panel and having one surface on which a driving chip is mounted; a flexible printed circuit board attached to one end of the display panel and bent toward a rear surface of the display panel and attached to the printed circuit board; a first reinforcing member between the display panel and the printed circuit board; and a second reinforcing member facing the first reinforcing member, the printed circuit board being between the first reinforcing member and the second reinforcing member, the second reinforcing member including a first region having a first thickness and being configured to overlap the driving chip and a second region having a second thickness and being configured to surround the first region, the second thickness being greater than the first thickness in a thickness direction of the display panel.

In an embodiment, the driving chip may be between the printed circuit board and the second reinforcing member.

In an embodiment, the first region of the second reinforcing member has a recessed groove, in which the driving chip is located.

In an embodiment, a depth of the recessed groove may be greater than or equal to a thickness of the driving chip.

In an embodiment, the display device may further include a bracket under the second reinforcing member.

In an embodiment, one surface of the bracket may have an accommodating groove that is in contact with the second reinforcing member, and the second reinforcing member may be in the accommodating groove.

In an embodiment, the second reinforcing member may cover the printed circuit board and may be coupled to the first reinforcing member.

BRIEF DESCRIPTION OF THE DRAWINGS

The accompanying drawings are included to provide a further understanding of the inventive concept, and are incorporated in and constitute a part of this specification. The drawings illustrate example embodiments of the inventive concept and, together with the description, serve to explain principles of the inventive concept. In the drawings.

DETAILED DESCRIPTION

Figure 1:
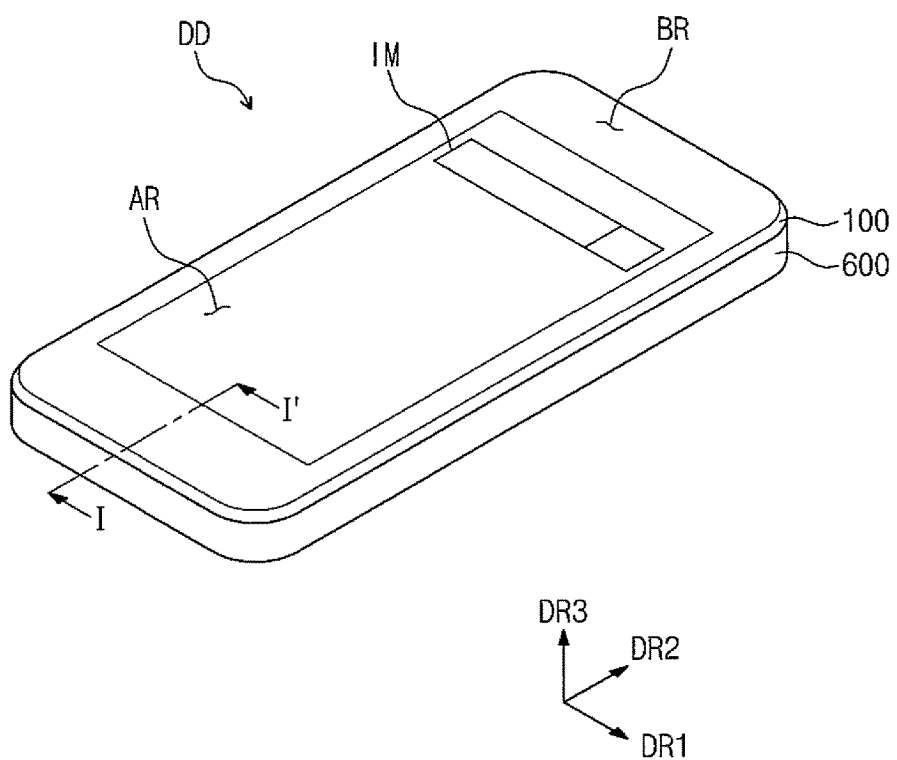
FIG. 1 is a perspective view illustrating a display device according to an embodiment of the inventive concept.

While the invention is amenable to various modifications and alternative forms, specific embodiments have been shown by way of example in the drawings and are described in detail below. The intention, however, is not to limit the invention to the particular embodiments described. On the contrary, the invention is intended to cover all modifications, equivalents, and alternatives falling within the scope of the invention as defined by the appended claims. In the drawings, parts not related to descriptions may be omitted for clarity, and like reference numerals in the drawings denote like elements throughout.

It will be understood that, although the terms "first," "second," "third," etc., may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section, without departing from the spirit and scope of the present invention.

Spatially relative terms, such as "top," "bottom," "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Further, it will also be understood that when one element, component, region, layer, and/or section is referred to as being "between" two elements, components, regions, layers, and/or sections, it can be the only element, component, region, layer, and/or section between the two elements, components, regions, layers, and/or sections, or one or more intervening elements, components, regions, layers, and/or sections may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprise," "comprises," "comprising," "includes," "including," and "include," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

It will be understood that when an element or layer is referred to as being "on," "connected to," "coupled to," "connected with," "coupled with," or "adjacent to" another element or layer, it can be "directly on," "directly connected to," "directly coupled to," "directly connected with," "directly coupled with," or "directly adjacent to" the other element or layer, or one or more intervening elements or layers may be present. Furthermore, "connection," "connected," etc., may also refer to "electrical connection," "electrically connected," etc., depending on the context in which such terms are used as would be understood by those skilled in the art. When an element or layer is referred to as being "directly on," "directly connected to," "directly coupled to," "directly connected with," "directly coupled with," or "immediately adjacent to" another element or layer, there are no intervening elements or layers present.

As used herein, "substantially," "about," and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively.

Features described in relation to one or more embodiments of the present invention are available for use in conjunction with features of other embodiments of the present invention. For example, features described in a first embodiment may be combined with features described in a second embodiment to form a third embodiment, even though the third embodiment may not be specifically described herein.

FIG. 1 is a perspective view illustrating a display device according to an embodiment of the inventive concept.

Referring to FIG. 1, a flat portable terminal is illustrated as an example of a display device DD according to an embodiment of the inventive concept. However, the embodiments of the inventive concept are not limited thereto, and the inventive concept may be applied to various display devices DD such as a curved display device, a bending-type display device, a rollable display device, a foldable display device, and a stretchable display device. Also, the display device DD according to the inventive concept may be used in small and medium-sized electronic devices, such as a personal computer, a notebook computer, a personal digital assistant, a car navigation unit, a game console, a portable electronic device, a wristwatch type electronic device, and a camera, as well as large-sized electric devices such as televisions or outdoor advertising boards. These devices are merely presented as examples, and the display device DD according to the inventive concept may be used in other suitable electronic devices without departing from the spirit and scope of the present invention.

The display device DD includes a plurality of areas on a display surface. The display device DD may include a display area AR, on which an image IM is displayed, and a non-display area BR adjacent to the display area AR. The display surface, on which the image IM is displayed, is parallel to a surface defined by a first direction DR1 and a second direction DR2, and a third direction DR3 indicates a normal direction of the display surface. The third direction DR3 is a reference axis that distinguishes between a front surface and a rear surface of each member. The third direction DR3 may be defined as a thickness direction of the display device DD. Hereinafter, the expression "viewed on a plane" denotes a case in which it is viewed from a direction parallel to the third direction DR3.

Figure 2:
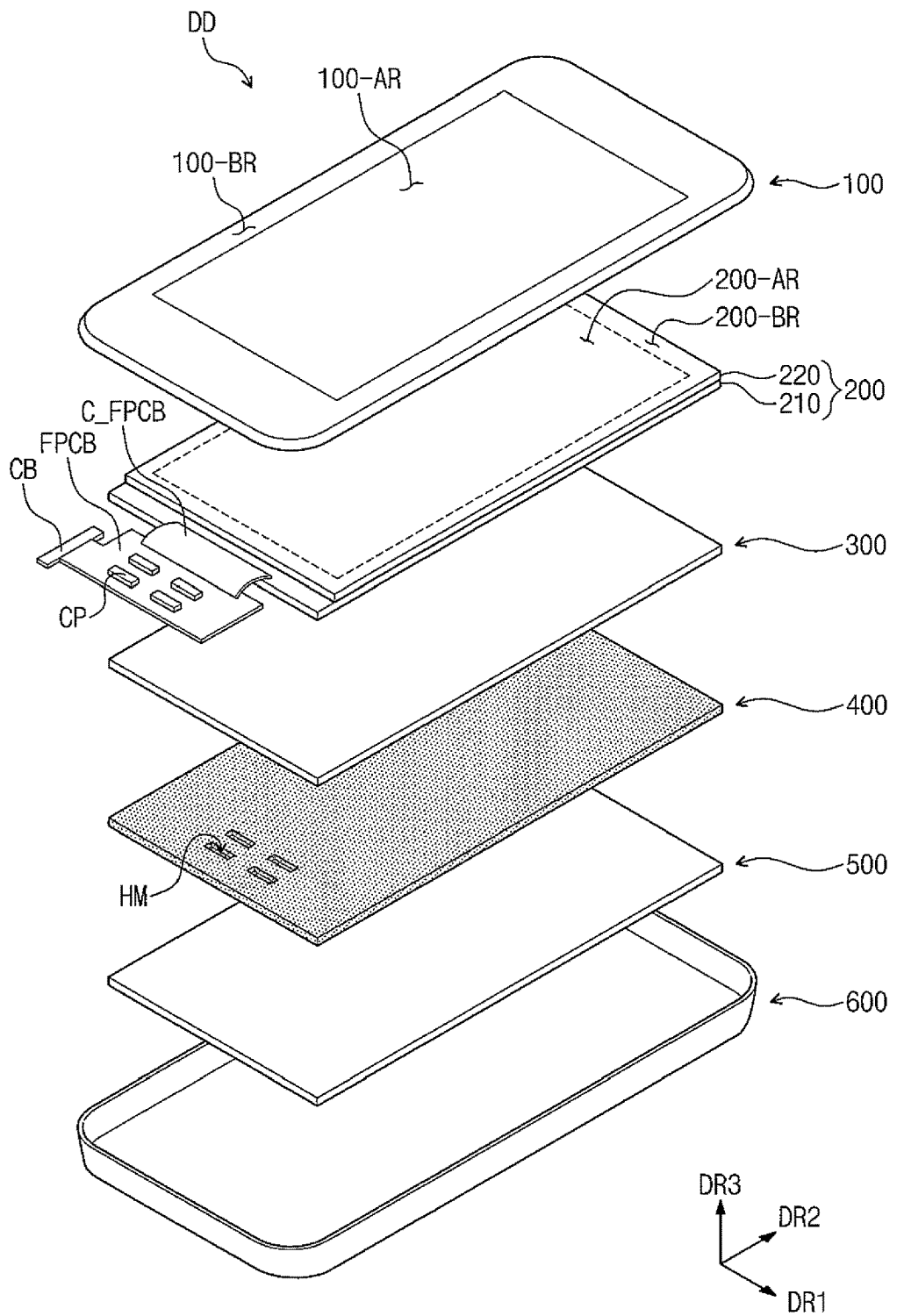
FIG. 2 is an exploded perspective view of the display device illustrated in FIG. 1.
Figure 3:
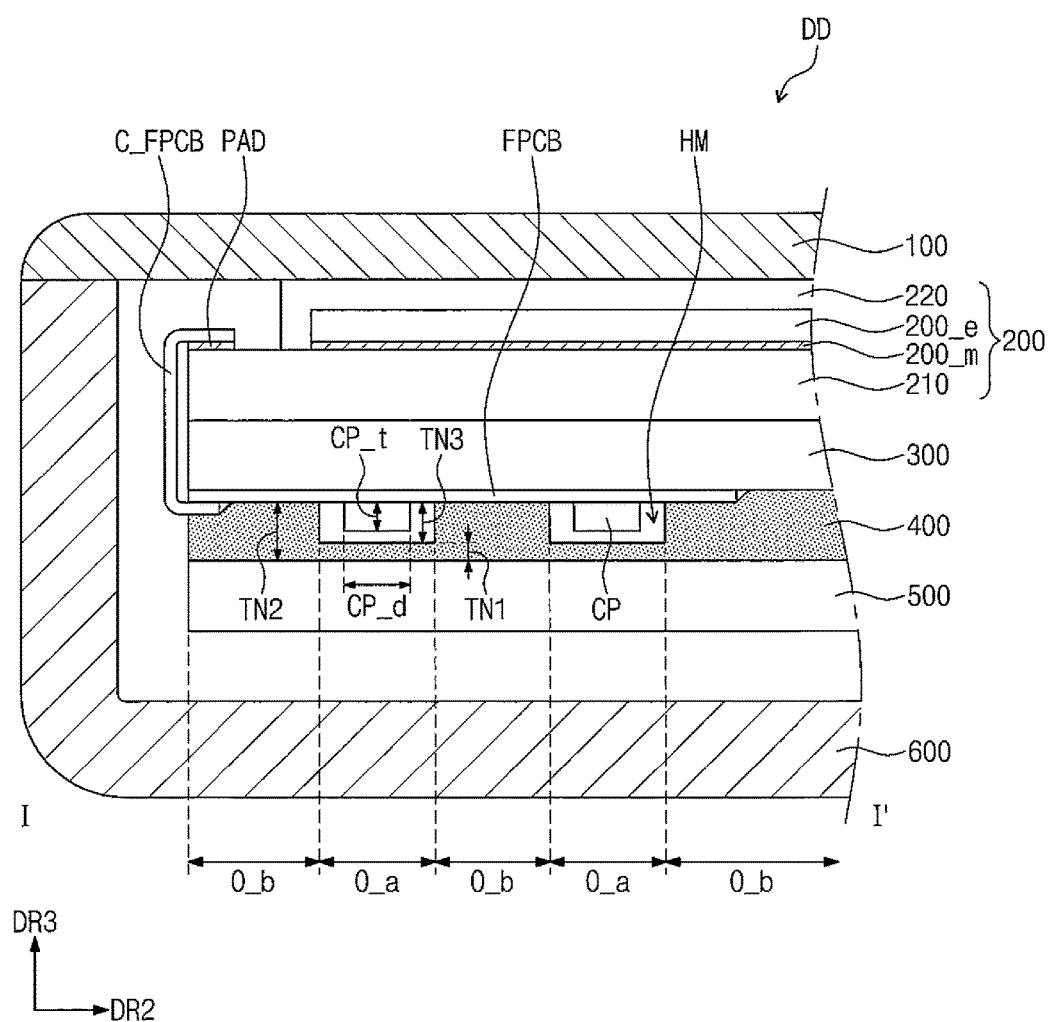
FIG. 3 is a cross-sectional view of the display device taken along the line I-I' of FIG. 1.

FIG. 2 is an exploded perspective view of the display device illustrated in FIG. 1. FIG. 3 is a cross-sectional view of the display device taken along the line I-I' of FIG. 1.

Referring to FIGS. 2 and 3, the display device DD may include a window 100 (e.g., a window member 100), a display panel 200, a first reinforcing member 300, a second reinforcing member 400, a bracket 500, and a rear case 600.

The window 100 may include a display area 100-AR configured to transmit the image (IM of FIG. 1), which is provided by the display panel 200, and a non-display area 100-BR adjacent to the display area 100-AR. The window 100 may be disposed on the display panel 200.

The window 100 may include a base (e.g., a base member) and a black matrix. The base may include any one of a silicon substrate, a glass substrate, a sapphire substrate, and a plastic film, but the embodiments of the inventive concept are not limited thereto. The black matrix may define a bezel area, i.e., the non-display area 100-BR, of the display device DD by being disposed on the rear surface of the base member. The black matrix is a colored organic layer, wherein the black matrix may be formed by a coating method. Also, the window 100 may further include a functional coating layer disposed on the front surface of the base member. The functional coating layer may include an anti-fingerprint layer, an anti-reflective layer, and a hard coating layer.

The display panel 200 includes a display area 200-AR and a non-display area 200-BR. The display area 200-AR is an area configured to display the image (IM of FIG. 1) and overlaps the display area 100-AR of the window 100. The non-display area 200-BR surrounds the display area 200-AR and overlaps the non-display area 100-BR of the window 100.

The display panel 200 generates the image (IM of FIG. 1) corresponding to input image data. In the present embodiment, a case, in which the display panel 200 is an organic light-emitting display panel, is described as an example. However, the embodiments of the inventive concept are not limited thereto, and the display panel may have various suitable forms.

The display panel 200 may include a base substrate 210, a circuit layer 200_m, an organic light-emitting device layer 200_e, and an encapsulation layer 220.

The base substrate 210 may include at least one of a silicon substrate, a glass substrate, a sapphire substrate, or a plastic film. The circuit layer 200_m, the organic light-emitting device layer 200_e, the encapsulation layer 220, and a pad unit PAD may be disposed on the base substrate 210.

The circuit layer 200_m may include a plurality of signal lines and electronic devices which are included in the display panel 200. For example, the circuit layer 200_m may include gate lines, data lines, and thin film transistors respectively corresponding to pixels.

The organic light-emitting device layer 200_e may generate light of a color corresponding to a luminescent material. The color may include red, green, blue, and white, but the embodiments of the inventive concept are not limited thereto.

The encapsulation layer 220 may include a thin film encapsulation layer (TFE), i.e., a plurality of inorganic thin films and a plurality of organic thin films. The encapsulation layer 220 may cover the organic light-emitting device layer 200_e and may protect the organic light-emitting device layer 200_e by blocking air and moisture. In an embodiment of the inventive concept, the encapsulation layer 220 may be substituted with an encapsulation substrate. The encapsulation substrate is spaced from the base substrate 210 having the organic light-emitting device layer 200_e disposed therebetween. The encapsulation substrate and the base substrate 210 may be bonded to each other by a sealant which is arranged along an edge of the base substrate 210.

The pad unit PAD may include pads which are in one-to-one correspondence with the plurality of signal lines electrically connected to the plurality of pixels and are electrically connected to the plurality of signal lines. The pad unit PAD may receive signals for driving the display panel 200 from a printed circuit board FPCB by being electrically connected to a flexible printed circuit board C_FPCB.

The flexible printed circuit board C_FPCB electrically connects the display panel 200 and the printed circuit board FPCB. One end of the flexible printed circuit board C_FPCB is connected to one surface of the base substrate 210 exposed by the encapsulation layer 220. The other end may be connected to the printed circuit board FPCB. Because the flexible printed circuit board C_FPCB is flexible, the flexible printed circuit board C_FPCB may be bent under the first reinforcing member 300 while still being coupled to the display panel 200.

Also, the display device DD may further include a touch sensor disposed on the display panel 200. The touch sensor may be classified into a resistive type, a capacitive type, or an electromagnetic induction type. However, these are only examples and various suitable touch sensors may be used. In a case in which the touch sensor is a capacitive type touch sensor, the touch sensor may include two types of crossing sensors, but the present invention is not limited thereto. A capacitive touch panel may obtain coordinate information of a touched point by a self-capacitance method or a mutual capacitance method.

The first reinforcing member 300 may be attached to a rear surface of the display panel 200.

Figure 4:
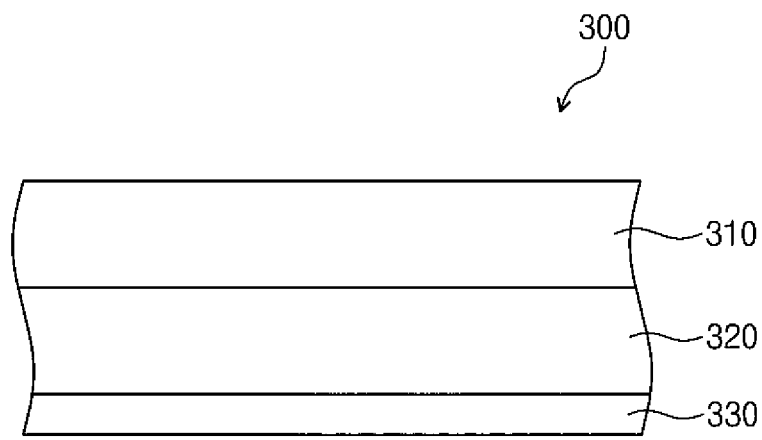
FIG. 4 is a cross-sectional view illustrating a first reinforcing member according to an embodiment of the inventive concept.

FIG. 4 is a cross-sectional view illustrating the first reinforcing member. Referring to FIG. 4, the first reinforcing member 300 may include a shielding layer 310, a heat dissipation layer 320, and a light-shielding layer 330.

The shielding layer 310 may include a conductive material. Copper, nickel, or ferrite may be used as the conductive material. However, the embodiments of the inventive concept are not limited thereto, and the shielding layer 310 may include various suitable materials capable of shielding an electromagnetic wave and having excellent thermal conductivity.

The heat dissipation layer 320 may include graphite molecules. The graphite molecule may have a plate-shaped structure in which carbon atoms are connected in a horizontal direction. Accordingly, thermal conductivity in the first direction DR1 and the second direction DR2 is higher than thermal conductivity in the third direction DR3, and the heat dissipation layer 320 has an excellent heat dissipation effect.

The heat dissipation layer 320 may be omitted depending on the degree of heat generated from a product.

The light-shielding layer 330 may shield light incident on the display panel 200 by being attached to a rear surface of the heat dissipation layer 320. The light-shielding layer 330 may absorb or reflect light. Also, the light-shielding layer 330 may prevent or substantially prevent the scattering of the graphite molecules of the heat dissipation layer 320. The light-shielding layer 330 may include black color coated polyethylene terephthalate (PET). However, this is only an example and the light-shielding layer 330 may include various suitable members.

Again, referring to FIGS. 2 and 3, the printed circuit board FPCB may output a signal on the display panel 200 or may receive a signal from the display panel 200 through the flexible printed circuit board C_FPCB. A connector CB for receiving a signal transmitted from the outside may be connected to the printed circuit board FPCB.

The printed circuit board FPCB, in the state of being coupled to the flexible printed circuit board C_FPCB, may be disposed on the rear surface of the display panel 200. Specifically, the printed circuit board FPCB may be disposed between the first reinforcing member 300 and the second reinforcing member 400.

A driving chip CP may be mounted on one surface of the printed circuit board FPCB. Specifically, the driving chip CP may be mounted on one surface of the printed circuit board FPCB adjacent to the second reinforcing member 400. Thus, the driving chip CP may be disposed between the printed circuit board FPCB and the second reinforcing member 400. The driving chip CP may generate a signal to drive the display panel 200 in response to the signal applied from the outside. Although it has been exemplarily illustrated in FIG. 2 that the four driving chips CP are arranged in the form of a matrix, the embodiments of the inventive concept are not limited thereto. For example, only one driving chip CP may be provided or the plurality of driving chips CP, i.e., two or more driving chips CP, may be provided.

The second reinforcing member 400 may be disposed to face the first reinforcing member 300 having the printed circuit board FPCB disposed therebetween.

Figure 5:
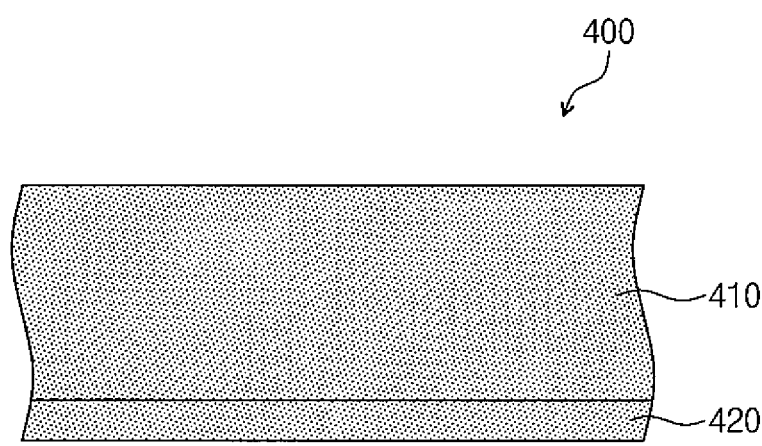
FIG. 5 is a cross-sectional view illustrating a second reinforcing member according to an embodiment of the inventive concept.

FIG. 5 is a cross-sectional view illustrating the second reinforcing member. Referring to FIG. 5, the second reinforcing member 400 may include a cushion layer 410 and a light-shielding layer 420.

The cushion layer 410 may be disposed between the light-shielding layer 420 and the printed circuit board FPCB. The cushion layer 410 may distribute an impact applied to the driving chip CP and the display panel 200. The cushion layer 410 may prevent or substantially prevent damage to the driving chip CP by absorbing a portion of the impact applied to the driving chip CP. Also, when compression due to misalignment of the driving chips CP occurs, the occurrence of compression defects in the display panel 200 may be prevented or substantially prevented by changes in the shape of the cushion layer 410.

The cushion layer 410 may be formed of a polymer resin (e.g., polyurethane, polycarbonate, polypropylene, and polyethylene), or may be formed of a sponge in which a rubber solution, a urethane-based material, or an acryl-based material is foam molded.

The light-shielding layer 420 may be substantially the same as the light-shielding layer 330 of the first reinforcing member 300. However, this is only an example and the light-shielding layer 420 may be omitted. Also, in another embodiment of the inventive concept, the light-shielding layer 420 may be changed into a transparent tape or the like.

A recessed groove HM configured to accommodate the driving chip CP may be at one surface of the second reinforcing member 400 facing the first reinforcing member 300. Thus, a thickness of the second reinforcing member 400 may be different depending on each region. For example, when viewed on a plane, i.e., from the third direction DR3, the second reinforcing member 400 may have a first region 0_a overlapping the driving chip CP and a second region 0_b surrounding the first region 0_a. A first thickness TN1 of the first region 0_a and a second thickness TN2 of the second region 0_b may be different from each other. Hereinafter, this will be described in detail in FIG. 6.

Referring again to FIGS. 2 and 3, the bracket 500 may be disposed under the second reinforcing member 400. One surface of the bracket 500 is attached to the second reinforcing member 400, and a space, on which electronic components may be mounted, may be provided to another surface of the bracket 500. The bracket 500 may be flat. However, this is only an example and the embodiments of the inventive concept are not limited thereto.

The rear case 600 may accommodate the display panel 200, the first reinforcing member 300, the second reinforcing member 400, and the bracket 500, and the rear case 600 may be coupled to the window 100. The rear case 600 may include plastic or metal. In some cases, the rear case 600 may be omitted.

Figure 6:
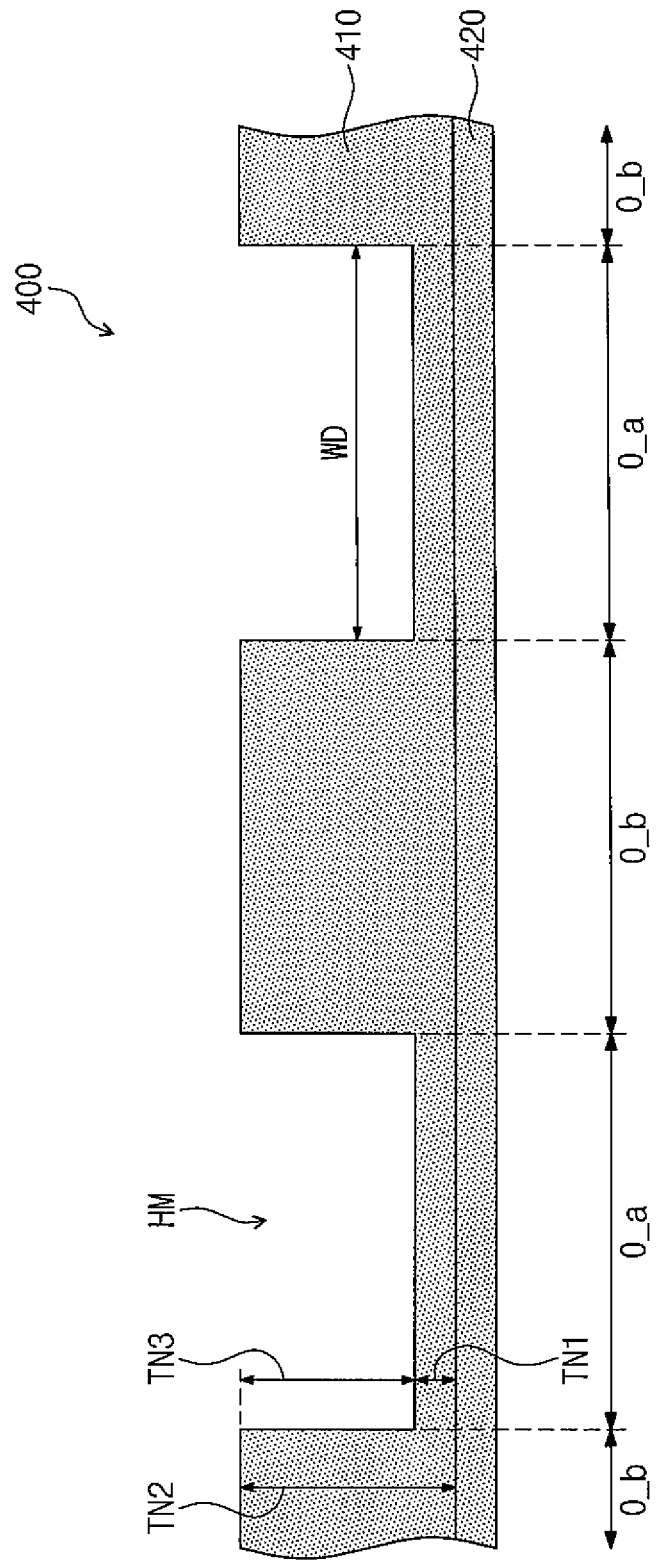
FIG. 6 is a cross-sectional view illustrating an enlarged portion of the second reinforcing member according to an embodiment of the inventive concept.

FIG. 6 is a cross-sectional view illustrating an enlarged portion of the second reinforcing member.

Referring to FIGS. 3 and 6, the recessed groove HM is formed in one surface of the second reinforcing member 400 facing the printed circuit board FPCB. The driving chip CP may be disposed in the recessed groove HM. The recessed groove HM may be provided to the first region 0_a.

Although it has been exemplarily illustrated in FIG. 3 that a depth TN3 of the recessed groove HM is greater than a thickness CP_t of the driving chip CP, the embodiments of the inventive concept are not limited thereto. For example, the depth TN3 of the recessed groove HM may be the same or substantially the same as the thickness CP_t of the driving chip CP. Also, although it has been exemplarily illustrated that a width WD of the recessed groove HM is greater than a width CP_d of the driving chip CP, the embodiments of the inventive concept are not limited thereto. For example, the width WD of the recessed groove HM may be the same or substantially the same as the width CP_d of the driving chip CP.

The light-shielding layer 420 may have substantially the same thickness in the first region 0_a and the second region 0_b. However, with respect to the cushion layer 410, thicknesses in the first region 0_a and the second region 0_b may be different from each other. For example, the cushion layer 410 may have the first thickness TN1 in the first region 0_a and may have the second thickness TN2 greater than the first thickness TN1 in the second region 0_b. A sum of the first thickness TN1 of the cushion layer 410 and the depth TN3 of the recessed groove HM may be substantially the same as the second thickness TN2 of the cushion layer 410.

According to the present embodiment, the cushion layer 410 having elasticity may cover the driving chip CP. Thus, the cushion layer 410 may prevent or substantially prevent damage to the driving chip CP by absorbing the portion of the impact applied to the driving chip CP even if an external force is applied to the display device DD. Also, when the compression due to the misalignment of the driving chips CP occurs, the occurrence of the compression defects in the display panel 200 may be prevented or reduced by changes in the shape of the cushion layer 410.

Figure 7:
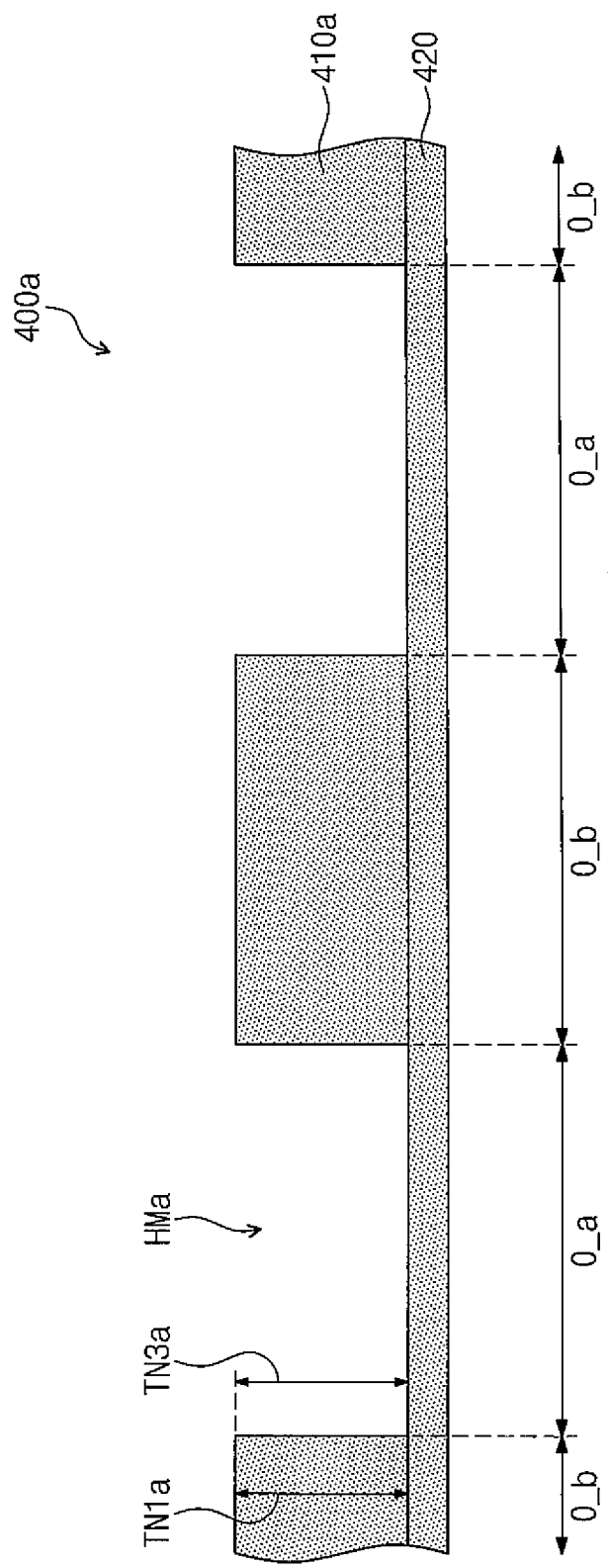
FIG. 7 is a cross-sectional view illustrating an enlarged portion of a second reinforcing member according to an embodiment of the inventive concept.

FIG. 7 is a cross-sectional view illustrating a second reinforcing member according to an embodiment of the inventive concept.

Referring to FIGS. 3 and 7, a second reinforcing member 400a has a difference in the shape of a cushion layer 410a when compared with the second reinforcing member 400 of FIG. 6. For example, the cushion layer 410 of FIG. 6 is disposed on an entire surface of the light-shielding layer 420, but the cushion layer 410a of FIG. 7 may be disposed on a portion of the light-shielding layer 420.

Specifically, when viewed from the third direction DR3, the cushion layer 410a may not overlap the first region 0_a. Thus, a recessed groove HMa may be defined by being surrounded by the light-shielding layer 420 and sides of the cushion layer 410a. A depth TN3a of the recessed groove HMa may be substantially the same as a thickness TN1a of the cushion layer 410a. Each of the depth TN3a of the recessed groove HMa and the thickness TN1a of the cushion layer 410a may be greater than the thickness CP_t of the driving chip CP.

When using the second reinforcing member 400a of FIG. 7, the thickness may be reduced by as much as a predetermined thickness (TN1 of FIG. 6) in comparison to a case in which the second reinforcing member 400 of FIG. 6 is used. Thus, realization of the thin display device DD may be facilitated.

Figure 8:
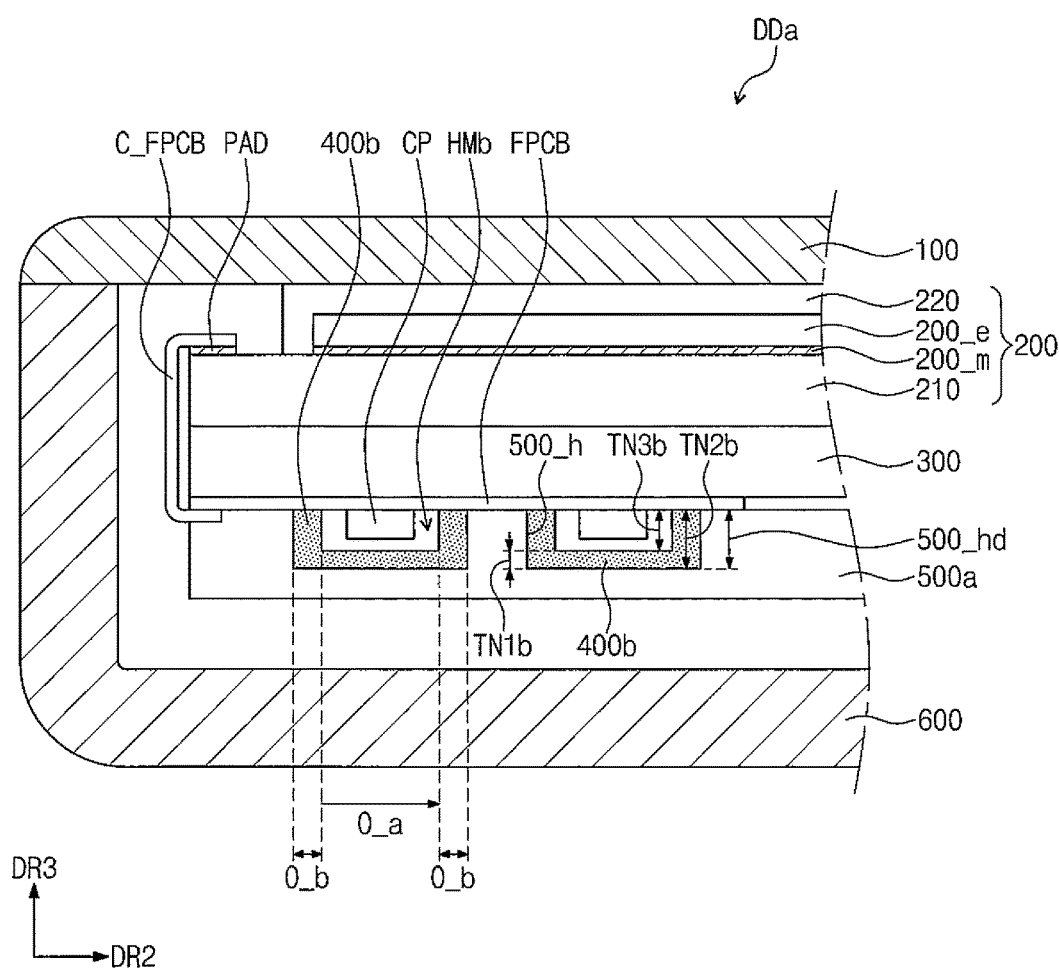
FIG. 8 is a cross-sectional view illustrating a display device according to an embodiment of the inventive concept.

FIG. 8 is a cross-sectional view illustrating a display device according to another embodiment of the inventive concept.

Referring to FIG. 8, a display device DDa has a difference in the shape of a second reinforcing member 400b and a bracket 500a, in comparison to the display device DD of FIG. 3.

An accommodating groove 500_h may be at one surface of the bracket 500a which is in contact with the second reinforcing member 400b. The accommodating groove 500_h has a concave shape from the one surface of the bracket 500a. The second reinforcing member 400b may be disposed in the accommodating groove 500_h.

A depth 500_hd of the accommodating groove 500_h may be substantially the same as a second thickness TN2b of a second region 0_b of the second reinforcing member 400b. A first thickness TN1b of a first region 0_a of the second reinforcing member 400b may be smaller than the second thickness TN2b of the second region 0_b. A depth TN3b of the recessed groove HMb may be greater than the thickness of the driving chip CP. Thus, a recessed groove HMb surrounded by the second reinforcing member 400b may be at the first region 0_a.

The driving chip CP may be disposed in the recessed groove HMb. Except for a surface mounted on the printed circuit board FPCB, the remaining portions of the driving chip CP may be surrounded by the second reinforcing member 400b. Thus, the cushion layer of the second reinforcing member 400b may prevent or substantially prevent damage to the driving chip CP by absorbing a portion of the impact applied to the driving chip CP even if an external force is applied to the display device DDa. Also, when the compression due to the misalignment of the driving chips CP occurs, the occurrence of compression defects in the display panel 200 may be prevented or reduced by changes in the shape of the cushion layer of the second reinforcing member 400b.

According to a display device according to an embodiment of the inventive concept, durability of the display device may be improved. Thus, display defects, which occur in the display device caused by a drop, may be reduced.

Although the example embodiments of the present invention have been described, it is to be understood that the present invention should not be limited to these example embodiments, but that various changes and modifications could be made by one of ordinary skill in the art and such changes and modifications would fall within the spirit and scope of the claims of the present application and their equivalents.

What is claimed is:

1. A display device comprising:
   a display panel configured to display an image;
   a printed circuit board under the display panel and having one surface on which a driving chip is mounted;
   a flexible printed circuit board attached to one end of the display panel and bent toward a rear surface of the display panel and attached to the printed circuit board;
   a first reinforcing member between the display panel and the printed circuit board; and
   a second reinforcing member under the printed circuit board configured to face the printed circuit board having the driving chip therebetween, the second reinforcing member having a recessed groove in one surface facing the driving chip and the driving chip being in the recessed groove, wherein the second reinforcing member comprises: a light-shielding layer; and a cushion layer between the light-shielding layer and the printed circuit board.

2. The display device of claim 1, wherein a depth of the recessed groove is greater than or equal to a thickness of the driving chip.

3. The display device of claim 1, wherein the second reinforcing member has a first region overlapping the driving chip and a second region surrounding the first region on a plane, and the first region has a first thickness and the second region has a second thickness that is greater than the first thickness.

4. The display device of claim 3, wherein the cushion layer has a third thickness in the first region and has a fourth thickness that is greater than the third thickness in the second region.

5. The display device of claim 4, wherein a difference between the third thickness and the fourth thickness is greater than or equal to the thickness of the driving chip.

6. The display device of claim 3, wherein the cushion layer does not overlap the first region when viewed from a thickness direction of the display panel.

7. The display device of claim 6, wherein a thickness of the cushion layer is greater than or equal to the thickness of the driving chip.

8. The display device of claim 1, wherein the first reinforcing member comprises:
   a light-shielding layer;
   a heat dissipation layer on the light-shielding layer; and
   a shielding layer on the heat dissipation layer, the shielding layer being attached to a rear surface of the display panel.

9. The display device of claim 8, wherein the shielding layer comprises a conductive material, and the heat dissipation layer comprises graphite molecules.

10. The display device of claim 1, further comprising a bracket under the second reinforcing member.

11. The display device of claim 10, wherein an accommodating groove is at one surface of the bracket that is in contact with the second reinforcing member, and the second reinforcing member is in the accommodating groove.

12. A display device comprising:
    a display panel;

a printed circuit board under the display panel and having one surface on which a driving chip is mounted;

a flexible printed circuit board attached to one end of the display panel and bent toward a rear surface of the display panel and attached to the printed circuit board;

a first reinforcing member between the display panel and the printed circuit board; and a second reinforcing member facing the first reinforcing member, the printed circuit board being between the first reinforcing member and second reinforcing member, the second reinforcing member comprising a first region having a first thickness and being configured to overlap the driving chip and a second region having a second thickness and being configured to surround the first region the second thickness being greater than the first thickness in a thickness direction of the display panel, wherein the second reinforcing member comprises: a light-shielding layer; and a cushion layer between the light-shielding layer and the printed circuit board.

13. The display device of claim 12, wherein the driving chip is between the printed circuit board and the second reinforcing member.

14. The display device of claim 12, wherein the first region of the second reinforcing member has a recessed groove, in which the driving chip is located.

15. The display device of claim 14, wherein a depth of the recessed groove is greater than or equal to a thickness of the driving chip.

16. The display device of claim 12, further comprising a bracket under the second reinforcing member.

17. The display device of claim 16, wherein one surface of the bracket has an accommodating groove that is in contact with the second reinforcing member, and the second reinforcing member is in the accommodating groove.

18. The display device of claim 12, wherein the second reinforcing member covers the printed circuit board and is coupled to the first reinforcing member.

* * * * *